United States Patent
Aquino et al.

(10) Patent No.: US 9,652,315 B1
(45) Date of Patent: May 16, 2017

(54) MULTI-CORE RAM ERROR DETECTION AND CORRECTION (EDAC) TEST

(71) Applicants: Lloyd F. Aquino, Marion, IA (US); John L. Hagen, Marion, IA (US); Todd E. Miller, Marion, IA (US); Branden H. Sletteland, Marion, IA (US)

(72) Inventors: Lloyd F. Aquino, Marion, IA (US); John L. Hagen, Marion, IA (US); Todd E. Miller, Marion, IA (US); Branden H. Sletteland, Marion, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 86 days.

(21) Appl. No.: 14/805,229

(22) Filed: Jul. 21, 2015

(51) Int. Cl.
*G06F 11/10* (2006.01)
*H03M 13/00* (2006.01)
*G06F 11/07* (2006.01)
*G06F 3/06* (2006.01)

(52) U.S. Cl.
CPC .......... *G06F 11/0724* (2013.01); *G06F 3/064* (2013.01); *G06F 3/0619* (2013.01); *G06F 3/0683* (2013.01); *G06F 11/1008* (2013.01)

(58) Field of Classification Search
CPC ............ G06F 11/1072; G06F 11/0724; G06F 12/128; G06F 15/80; G06F 3/0683; G06F 3/0619
See application file for complete search history.

(56) References Cited

U.S. PATENT DOCUMENTS

| 7,020,800 B2 * | 3/2006 | Fu ....................... G06F 11/1492 714/38.13 |
| 7,343,515 B1 * | 3/2008 | Gilbertson .......... G06F 11/0712 714/10 |

(Continued)

OTHER PUBLICATIONS

Behbahani et al., Multi-core processors: an enabling technology for embedded distributed model-based control (Post print), Jul. 2008, American institute of Aeronautics and Astronautics, pp. 1 to 13.*

(Continued)

*Primary Examiner* — Shelly A Chase
(74) *Attorney, Agent, or Firm* — Angel N. Gerdzhikov; Donna P. Suchy; Daniel M. Barbieri

(57) ABSTRACT

A system and method for detection and correction of single-bit errors in a multi-core processing resource (MCPR) of an avionics processing system includes a RAM EDAC testing module called by the MCPR health monitor to access EDAC registers of a system-on-chip module coupled to the MCPR and access memory addresses passed by the MCPR health monitor to detect single-bit errors. Single-bit errors detected in memory mapped to the hypervisor are corrected by the RAM EDAC testing module. Single-bit errors detected in memory associated with a partition or core of the MCPR are corrected by the health monitor running on the particular partition or core with which the memory portion is associated. Single-bit errors may be detected in unmapped memory associated with a partition or core by accessing the unmapped memory via a temporary TLB entry.

17 Claims, 3 Drawing Sheets

(56) References Cited

U.S. PATENT DOCUMENTS

| | | | | |
|---|---|---|---|---|
| 7,370,243 | B1* | 5/2008 | Grohoski | G06F 9/3851 |
| | | | | 714/25 |
| 8,407,515 | B2* | 3/2013 | Heyrman | G06F 11/2082 |
| | | | | 714/6.12 |
| 8,601,128 | B2* | 12/2013 | Ford | G06F 9/5077 |
| | | | | 709/226 |
| 2008/0235454 | A1* | 9/2008 | Duron | G06F 11/1064 |
| | | | | 711/128 |

OTHER PUBLICATIONS

Lofwenmark et al., Challenges in future avionic systems on multicore platforms, 2014, IEEE, pp. 115 to 119.*

* cited by examiner

260 — If the at least one second bit error is associated with the first processor partition, correcting the at least one second bit error via the first health monitor 270 — If the at least one second bit error is associated with the at least one second processor partition,
(1) notifying a second health monitor associated with the at least one second processor partition of at least one of the second bit error and the third memory address via the first health monitor and
(2) correcting the at least one second bit error via the at least one second health monitor

MULTI-CORE RAM ERROR DETECTION AND CORRECTION (EDAC) TEST

CROSS-REFERENCE TO RELATED APPLICATIONS

The present application is related to U.S. patent application Ser. No. 14/743,739, filed Jun. 18, 2015. The present application is related to U.S. patent application Ser. No. 14/743,868, filed Jun. 18, 2015. U.S. patent application Ser. Nos. 14/743,739 and 14/743,868 are herein incorporated by reference in their entirety.

BACKGROUND

Avionics computer systems designed for use at high altitudes are especially vulnerable to single-event upsets caused by the collision of cosmic rays, or atmospheric particles (e.g., protons, neutrons) liberated by cosmic rays, with aircraft microelectronics. While the resulting state change, e.g., flipping a bit to its complement, may be a "soft error" not permanently damaging to the hardware, the built-in hardware correction logic may have no practical way of correcting such an error, especially if a double-bit error occurs (i.e., two bits in the same "word" are flipped to their respective complements). Resetting the module may not be an acceptable solution for a safety-critical multi-core avionics processing system. Prior approaches to this problem, such as simultaneous access to RAM or newer processor privilege modes, may not provide optimal solutions in a newer multi-core processing environment.

It may therefore be desirable to prevent a module reset due to a double-bit RAM error caused by single-event upsets (ex.—bit errors) by providing a means of correcting single-bit errors in the multi-core processing resource (MCPR). It may further be desirable to provide a means of correcting single-bit errors in the MCPR that prevents memory mapped to an executing partition (ex.—core) of the processor system from being modified by another processor or core (or by the hypervisor of the processor system) during testing. It may further be desirable to provide a means of correcting single-bit errors in the MCPR that accounts for single-point ownership and access to error detection and correction (EDAC) registers of a system-on-chip (SoC) module of the processor system. It may further be desirable to provide a means of correcting single-bit errors in the MCPR that is not only scalable (e.g., of selectable size or range) but capable of testing the entirety of system RAM, not just that portion of system RAM mapped by the hypervisor.

SUMMARY

In one aspect, embodiments of the inventive concepts disclosed herein are directed to a multi-core processor system. In one embodiment, the multi-core processor system includes a multi-core processing resource (MCPR) including one or more processors or cores partitioned into a first partition and at least one second partition. For example, the first partition includes an MCPR health monitor configured to run on the first partition, and each second partition includes a partition-level health monitor configured to run on the second partition. The MCPR includes a system memory (ex.—system RAM) having at least a first portion mapped to the first partition, a second portion mapped to each second partition, a third portion mapped to the hypervisor of the MCPR, and a fourth unmapped portion. Each portion includes at least one memory address; mapped portions are mapped by the hypervisor. A system-on-a-chip (SoC) module coupled to the MCPR may include at least one error detection and correction (EDAC) register. The MCPR may include a RAM EDAC test module coupled to the system memory and the EDAC registers. For example, the MCPR health monitor may initiate a RAM EDAC test by passing a starting address and a range of memory addresses to the RAM EDAC test module, which determines whether the range of addresses includes a bit error by checking the memory addresses and the corresponding EDAC registers. If a single-bit error is detected in memory mapped to the hypervisor, the RAM EDAC test module corrects the error. If a single-bit error is detected in memory mapped to the first or second partitions, the RAM EDAC test module notifies the MCPR health monitor. If the error is detected in memory mapped to the first partition, the MCPR health monitor then corrects the error. Otherwise, the MCPR health monitor passes the address of the error to the appropriate partition-level health monitor for correction.

In a further aspect, the inventive concepts disclosed herein are directed to a method for error detection and correction in a multi-core processor system including an MCPR having one or more processors. In one embodiment, the method includes passing a starting memory address and memory range to a RAM EDAC test module of the MCPR via an MCPR health monitor running on a first partition of the one or more processors. For example, the memory address and memory range may be mapped to a hypervisor of the MCPR, mapped to the first partition, or mapped to a second partition. The method may include determining, via the RAM EDAC test module, whether any memory address includes a single-bit error by accessing the range of memory addresses and the error detection and correction (EDAC) registers of a system-on-chip (SoC) module of the processor system. If a single-bit error is detected in memory mapped to the hypervisor, the RAM EDAC test module corrects the error. If a single-bit error is detected in memory mapped to a processor partition, the RAM EDAC test module notifies the MCPR health monitor. If the error is detected in memory mapped to the first partition, the MCPR health monitor then corrects the error. If the error is detected in memory mapped to a second partition, the MCPR health monitor then notifies the appropriate partition-level health monitor, which corrects the error.

BRIEF DESCRIPTION OF THE DRAWINGS

The inventive concepts disclosed herein may be better understood by those skilled in the art by reference to the accompanying figures in which:

FIGS. 2A and 2B are process flow diagrams illustrating a method according to embodiments of the inventive concepts disclosed herein.

DETAILED DESCRIPTION

Features of the inventive concepts disclosed herein in their various embodiments are exemplified by the following descriptions with reference to the accompanying drawings, which describe the inventive concepts with further detail. It is to be understood that both the foregoing general description and the following detailed description are exemplary and explanatory only and are not necessarily restrictive of the inventive concepts disclosed and claimed herein. These drawings depict only exemplary embodiments of the inventive concepts, and should not be considered to limit their scope in any way.

Figure 1:
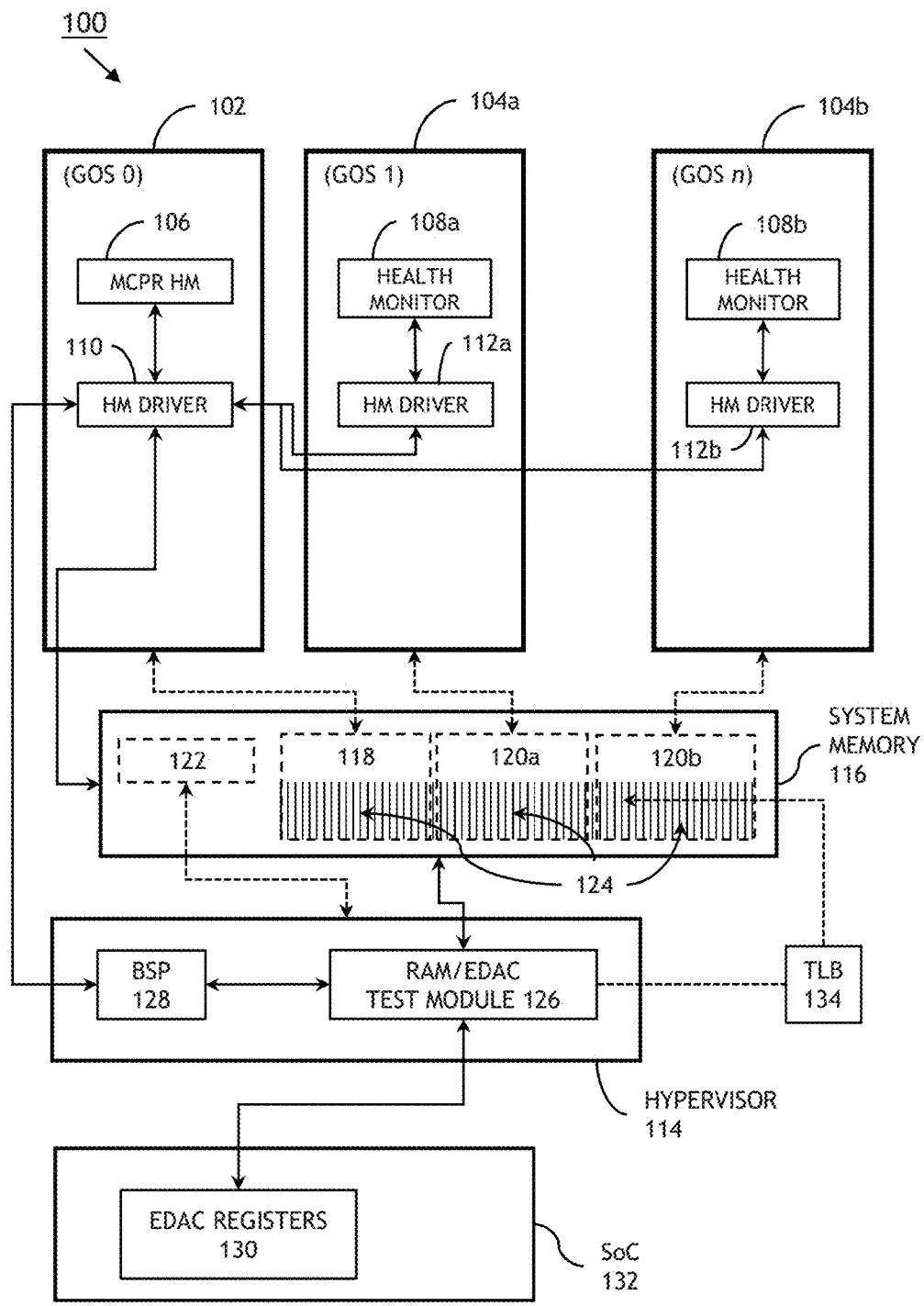
FIG. 1 is a block diagram depicting a processor system according to embodiments of the inventive concepts disclosed herein.

FIG. 1 illustrates a multi-core processing system 100 according to embodiments of the inventive concepts disclosed herein. The multi-core processing system 100 (ex.—multi-core processing resource (MCPR)) may include one or more processors partitioned into a first partition 102 and one or more second partitions 104 (104a, 104b). The first partition 102 may include a MCPR health monitor (HM) 106 responsible for systemwide HM functions, while each second partition 104 may include a partition-level health monitor 108 responsible for HM functions at the partition or guest operating system (GOS) level. The MCPR HM 106 may additionally include a MCPR HM driver 110, and each partition-level HM 108 may additionally include a HM driver 112. The processor system 100 may include a hypervisor (ex.—module operating system) 114 responsible for mapping portions of the system memory 116 (ex.—system RAM) to individual processor partitions 102, 104 as well as to the hypervisor 114 itself. The system memory 116 may include a first memory portion 118 associated with (ex.—owned by) the first partition 102, a second memory portion 120 associated with each second partition 104, and a third memory portion 122 associated with the hypervisor 114. The first memory portion 118 may include a memory portion mapped to the first partition 102 by the hypervisor 114, and each second memory portion 120 may include a portion mapped to the "owning" second partition 104 by the hypervisor 114. For example, memory portion 120a may be mapped to partition 104a, and memory portion 120b mapped to partition 104b. In one embodiment, the hypervisor 114 is unable to map the entirety of the system memory 116 and still have room for other required devices. Therefore, the first portion 118 and each second portion 120 may include an unmapped memory portion 124; unmapped memory 124 is associated with an "owning" partition 102, 104, but not mapped to that partition by the hypervisor 114. A RAM Error Detection and Correction (EDAC) test module 126 may be incorporated into the hypervisor 114. For example, the RAM EDAC test module 126 may be accessed by the MCPR HM driver 110 via a board support package (BSP) 128 of the hypervisor 114. The RAM EDAC test module 126 may have single point access to EDAC registers 130 in the system-on-a-chip (SoC) module 132. The EDAC registers 130 may indicate whether a bit error has occurred. Double-bit errors may be handled by the processor system 100 in the usual way.

The MCPR health monitor 106 may initiate a test of the system memory 116 by passing a range of memory addresses to be tested to the RAM EDAC test module 126. For example, the MCPR health monitor 106 may call the MCPR HM driver 110, and the MCPR HM driver 110 may then (via BSP 128) supply the RAM EDAC test module 126 with a starting address and a size parameter indicating the range of memory addresses to be tested. The processor system 100 may define this size parameter as a fixed size corresponding to a fixed range of memory addresses (e.g., 64 bytes). Mappings and ownership of the system memory 116 (e.g., by the hypervisor 114) may be visible to the MCPR health monitor 106. Therefore, the MCPR health monitor 106 may know that certain portions of the system memory 116 (e.g., shared memory, Direct Memory Access (DMA)) are exempt from testing. Consequently, the MCPR health monitor 106 and MCPR HM driver 110 may refrain from initiating a test of exempt memory ranges or portions.

The RAM EDAC test module 126 may then access the memory addresses passed by the MCPR HM driver 110 in an attempt to generate a single-bit error. The RAM EDAC test module 126 may additionally check the corresponding EDAC registers 130 to determine if a bit error has occurred (ex.—check for the presence of a nonzero register entry indicating a bit error). The RAM EDAC test module 126 may be capable of determining whether a memory address or range of addresses passed by the MCPR HM driver 110 belongs to memory associated with the hypervisor 114 (memory portion 122), or to memory associated with a processor partition 102, 104a, 104b (memory portions 118, 120a, 120b, including unmapped memory 124). If the MCPR HM driver 110 passes a range of memory addresses of unmapped memory 124 of the system memory 116, the RAM EDAC test module 126 may access the unmapped memory 124 by generating a temporary Translation Lookaside Buffer (TLB) entry 134. For example, the TLB entry 134 may use a single virtual starting memory address, while the precise physical memory address to which the virtual starting memory address refers may change depending on the address range passed by the MCPR HM driver 110. After testing of an unmapped range of memory addresses completes, the RAM EDAC test module 126 may then destroy the TLB entry 134. Any single-bit errors detected in unmapped memory 124 may then be passed up to the MCPR health monitor 106 for correction by the health monitor 106, 108 running on the partition 102, 104 with which the unmapped memory 124 is associated.

If a single-bit error is detected in a memory portion 118 associated with the first partition 102 of the processor system 100, the RAM EDAC test module 126 may then notify the MCPR health monitor 106 of the detected error and the corresponding memory address via the MCPR HM driver 110. The MCPR health monitor 106 may then correct the error. If a single-bit error is detected in a memory portion 120 associated with a second partition 104 of the processor system 100, the RAM EDAC test module 126 may notify the MCPR HM driver 110 of the error and its location. For example, the MCPR HM driver 110 may then pass the error to the appropriate second partition 104 (via the health monitor driver 112 of the second partition) for correction by the corresponding partition-level health monitor 108. For example, if a single-bit error is detected in a memory address of memory portion 120a, associated with partition 104a, the RAM/EDAC test module 126 may notify the MCPR HM driver 110 of the error and the associated memory address. The MCPR HM driver 110 may then pass the error and associated address to a queue or similar data structure associated with the second partition 104a. The partition-level health monitor 108a of the second partition 104a may then correct the error. Any double-bit error generated or detected may be handled by the processor system 100 in the usual way.

Figure 2A:
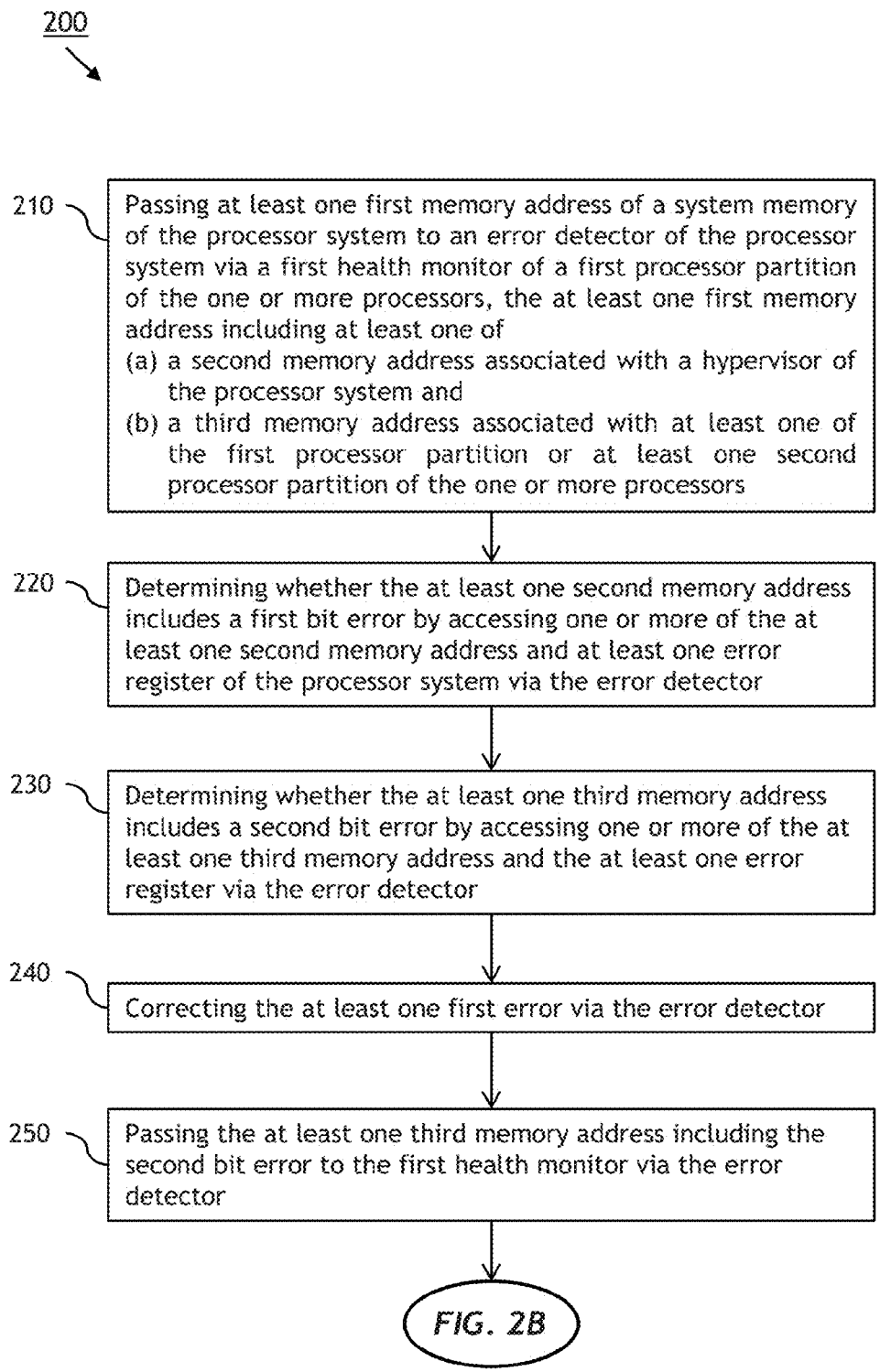

FIGS. 2A-2B illustrate a method 200 for error detection and correction in a processor system 100 including a multi-core processing resource (MCPR) according to embodiments of the inventive concepts disclosed herein. At a step 210, an MCPR health monitor 106 of the processor system 100 passes (via the MCPR HM driver 110) at least one first memory address of a system memory 116 of the processor system 100 to a RAM EDAC test module 126 of the processor system 100, the at least one first memory address including at least one of a second memory address associated with a hypervisor 114 of the processor system 100 and a third memory address associated with at least one of the first processor partition 102 or at least one second processor partition 104 of the MCPR. For example, the MCPR HM driver 110 may pass a starting memory address and a range of memory addresses (or a size parameter corresponding to the range of addresses). Further, the at least one third memory address passed by the MCPR HM driver 110 may include at least one memory address or range of memory addresses associated with an unmapped portion 124 of the system memory 116 (unmapped to either the first processor partition 102 or the at least one second processor partition 104).

At a step 220, the RAM EDAC test module 126 determines whether the at least one second memory address (associated with the hypervisor 114) includes a first single-bit error by accessing one or more of the at least one second memory address and at least one EDAC register 130 of the processor system 100.

At a step 230, the RAM EDAC test module 126 determines whether the at least one third memory address (associated with at least one of the first processor partition 102 or at least one second processor partition 104) includes a second single-bit error by accessing one or more of the at least one third memory address and the at least one EDAC register 130. For example, if the at least one third memory address includes at least one fifth memory address associated with an unmapped portion 124 of the system memory 116, the RAM EDAC test module 126 may generate at least one temporary Translation Lookaside Buffer (TLB) entry 134, access the at least one fifth memory address via the at least one temporary TLB entry 134, and then destroy the at least one temporary TLB entry 134.

At a step 240, the RAM EDAC test module 126 corrects the first single-bit error. For example, the RAM EDAC test module 126 may additionally generate a notification including the at least one second memory address (associated with the hypervisor 114) and the at least one first single-bit error. The RAM EDAC test module 126 may then pass the notification to the MCPR health monitor 106 (via the MCPR HM driver 110).

At a step 250, the RAM EDAC test module 126 passes the at least one third memory address (associated with at least one of the first processor partition 102 or at least one second processor partition 104) including the second single-bit error to the MCPR health monitor 106.

In one embodiment, the method 200 may include additional steps 260 and 270. At a step 260, if the at least one second single-bit error is associated with the first partition 102 (i.e., detected in memory associated with the first partition 102), the MCPR health monitor 106 may correct the at least one second single-bit error.

At a step 270, if the at least one second single-bit error is associated with the at least one second partition 104 (i.e., detected in memory associated with the at least one second partition 104), the MCPR health monitor 106 may notify (via the MCPR HM driver 110) a partition-level health monitor 108 associated with the at least one second partition 104 of at least one of the second single-bit error and the third memory address. The health monitor 108 running on the second partition 104 associated with the at least one third memory address may then correct the second single-bit error.

While particular aspects of the inventive concepts disclosed herein have been shown and described, it will be apparent to those skilled in the art that, based upon the teachings herein, changes and modifications may be made without departing from the scope of the inventive concepts disclosed herein and their broader aspects and, therefore, the appended claims are to encompass within their scope all such changes and modifications as are within the broad scope of the inventive concepts disclosed herein.

We claim:

1. A processor system comprising:
a multi-core processing resource (MCPR) including one or more processors, the one or more processors including a first processor partition and at least one second processor partition, the first processor partition including a first health monitor configured to run on the first processor partition, the at least one second processor partition including at least one second health monitor configured to run on the at least one second processor partition;
at least one system memory coupled to the one or more processors, the at least one system memory including at least
a first portion associated with the first processor partition, the first portion including at least one first memory address;
at least one second portion associated with the at least one second processor partition, the at least one second portion including at least one second memory address; and
at least one third portion associated with a hypervisor of the MCPR, the at least one third portion including at least one third memory address;
at least one system-on-a-chip (SoC) module coupled to the MCPR, the at least one SoC module including at least one error register;
the at least one hypervisor of the MCPR coupled to the one or more processors and configured to define the first portion, the at least one second portion, and the at least one third portion; and
at least one error detector coupled to the at least one system memory and to the SoC module, the first health monitor configured to pass at least one of a first memory address, a second memory address, and a third memory address to the at least one error detector;
the at least one error detector configured to
(a) determine whether the at least one first memory address includes a first single-bit error by accessing one or more of the at least one first memory address and the at least one error register;
(b) determine whether the at least one second memory address includes a second single-bit error by accessing one or more of the at least one second memory address and the at least one error register;
(c) determine whether the at least one third memory address includes a third single-bit error by accessing one or more of the at least one third memory address and the at least one error register;
(d) correct the at least one third single-bit error; and
(e) pass one or more of (1) the at least one first memory address and the at least one first single-bit error and (2) the at least one second memory address and the at least one second single-bit error to the first health monitor.

2. The processor system of claim 1, wherein the first health monitor is configured to
correct the at least one first single-bit error; and
if the at least one second single-bit error is detected in the at least one second portion, pass the at least one second memory address and the at least one second single-bit error to the at least one second health monitor.

3. The processor system of claim 2, wherein the at least one second health monitor is configured to correct the at least one second single-bit error.

4. The processor system of claim 1, wherein:
the first portion includes
at least one fourth portion mapped to the first processor partition and including at least one fourth memory address, and
at least one fifth portion unmapped to the first processor partition and including at least one fifth memory address;
the at least one third portion is mapped to the at least one hypervisor of the MCPR; and
the at least one second portion includes
at least one sixth portion mapped to the at least one second processor partition and including at least one sixth memory address; and
at least one seventh portion unmapped to the at least one second processor partition and including at least one seventh memory address.

5. The processor system of claim 4, wherein the at least one error detector is configured to:
generate a first cache;
determine whether at least one of the at least one fifth memory address and the at least one seventh memory address includes a fourth single-bit error by accessing at least one of the at least one fifth memory address, the at least one seventh memory address, and the at least one error register via the first cache; and
destroy the first cache.

6. The processor system of claim 4, wherein the at least one hypervisor of the MCPR is configured to map the at least one fourth portion to the first processor partition, to map the at least one sixth portion to the at least one second processor partition, and to map the at least one third portion to the at least one hypervisor of the MCPR.

7. The processor system of claim 1, wherein the first health monitor includes an MCPR health monitor.

8. The processor system of claim 1, wherein the processor system is embodied in an ARINC 653 compliant avionics processor system.

9. The processor system of claim 1, wherein:
the MCPR includes one or more multi-core processors; and
the at least one processor partition includes at least one processor core.

10. The processor system of claim 1, wherein:
the MCPR includes one or more multithreaded processors, each multithreaded processor having at least one of a thread and an execution unit; and
the at least one processor partition includes at least one of a thread and an execution unit.

11. A method for error detection and correction in a processor system including a multi-core processing resource (MCPR) having one or more processors, the method comprising:
passing at least one first memory address of a system memory of the processor system to an error detector of the processor system via a first health monitor of a first processor partition of the one or more processors, the at least one first memory address including at least one of
(a) a second memory address associated with a hypervisor of the processor system and
(b) a third memory address associated with at least one of the first processor partition or at least one second processor partition of the one or more processors;
determining whether the at least one second memory address includes a first single-bit error by accessing one or more of the at least one second memory address and at least one error register of the processor system via the error detector;
determining whether the at least one third memory address includes a second single-bit error by accessing one or more of the at least one third memory address and the at least one error register via the error detector;
correcting the at least one first single-bit error via the error detector; and
passing the at least one third memory address including the second single-bit error to the first health monitor via the error detector.

12. The method of claim 11, wherein passing at least one first memory address of a system memory of the processor system to an error detector of the processor system via a first health monitor of a first processor partition of the one or more processors, the at least one first memory address including at least one of (a) a second memory address associated with a hypervisor of the processor system and (b) a third memory address associated with at least one of the first processor partition or at least one second processor partition of the one or more processors includes:
passing at least one of a first memory address of a system memory of the processor system and a first memory range including the first memory address to an error detector of the processor system via a first health monitor of a first processor partition of the one or more processors, the at least one of a first memory address and a first memory range including at least one of
(a) a second memory address and a second memory range including the second memory address, the second memory address and the second memory range associated with a hypervisor of the processor system, and
(b) a third memory address and a third memory range including the third memory address, the third memory address and the third memory range associated with at least one of the first processor partition and the at least one second processor partition.

13. The method of claim 11, further comprising:
if the at least one second single-bit error is associated with the first processor partition, correcting the at least one second single-bit error via the first health monitor; and
if the at least one second single-bit error is associated with the at least one second processor partition, (1) notifying a second health monitor associated with the at least one second processor partition of at least one of the second single-bit error and the third memory address via the first health monitor and (2) correcting the at least one second single-bit error via the at least one second health monitor.

14. The method of claim 11, wherein correcting the at least one first single-bit error via the error detector includes:
generating a notification including the at least one second memory address and the at least one first single-bit error via the error detector; and
passing the notification to the first health monitor via the error detector.

15. The method of claim 11, wherein passing at least one first memory address of a system memory of the processor system to an error detector of the processor system via a first health monitor of a first processor partition of the one or more processors, the at least one first memory address including at least one of (a) a second memory address associated with a hypervisor of the processor system and (b) a third memory address associated with at least one of the first processor partition or at least one second processor partition of the one or more processors includes:
passing at least one first memory address of a system memory of the processor system to an error detector of the processor system via a first health monitor of a first processor partition of the one or more processors, the at least one first memory address including at least one of (a) a second memory address associated with a hypervisor of the processor system and (b) a third memory address associated with the first processor partition or at least one second processor partition of the one or more processors, wherein the third memory address includes at least one of (1) a fourth memory address mapped to at least one of the first processor partition and the at least one second processor partition and (2) a fifth memory address unmapped to either the first processor partition or the at least one second processor partition.

16. The method of claim 15, wherein passing at least one first memory address of a system memory of the processor system to an error detector of the processor system via a first health monitor of a first processor partition of the one or more processors, the at least one first memory address including at least one of (a) a second memory address associated with a hypervisor of the processor system and (b) a third memory address associated with the first processor partition or at least one second processor partition of the one or more processors, wherein the third memory address includes at least one of (1) a fourth memory address mapped to at least one of the first processor partition and the at least one second processor partition and (2) a fifth memory address unmapped to either the first processor partition or the at least one second processor partition includes:
passing at least one of a first memory address of a system memory of the processor system and a first memory range including the first memory address to an error detector of the processor system via a first health monitor of a first processor partition of the one or more processors, the at least one of a first memory address and a first memory range including at least one of (a) a second memory address and a second memory range including the second memory address, the second memory address and the second memory range associated with a hypervisor of the processor system, and (b) a third memory address and a third memory range including the third memory address, the third memory address and the third memory range associated with at least one of the first processor partition and the at least one second processor partition, wherein the third memory address and the third memory range includes at least one of (1) a fourth memory address and a fourth memory range including the fourth memory address, the fourth memory address and the fourth memory range associated with at least one portion of the system memory mapped to the at least one of the first processor partition and the at least one second processor partition, and (2) a fifth memory address and a fifth memory range including the fifth memory address, the fifth memory address and the fifth memory range associated with at least one unmapped portion of the system memory.

17. The method of claim 15, wherein determining whether the at least one third memory address includes a second single-bit error by accessing one or more of the at least one third memory address and the at least one error register via the error detector includes:
generating at least one first cache via the error detector;
accessing the at least one fifth memory address via the at least one first cache; and
destroying the at least one first cache.

* * * * *